(12) United States Patent
Hirata et al.

(10) Patent No.: US 6,528,347 B2
(45) Date of Patent: Mar. 4, 2003

(54) MANUFACTURING METHOD FOR MAKING A MICROWAVE SEMICONDUCTOR DEVICE WITH IMPROVED HEAT DISCHARGE AND ELECTRIC PROPERTIES

(75) Inventors: Seiichi Hirata, Kanagawa-ken (JP); Kazutaka Takagi, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/094,651

(22) Filed: Mar. 12, 2002

(65) Prior Publication Data

US 2002/0089068 A1 Jul. 11, 2002

Related U.S. Application Data

(62) Division of application No. 09/804,239, filed on Mar. 13, 2001, now Pat. No. 6,400,035.

(30) Foreign Application Priority Data

Mar. 27, 2000 (JP) .......................................... 2000-86847

(51) Int. Cl.[7] ................................................ H01L 21/44
(52) U.S. Cl. ...................................................... 438/108
(58) Field of Search ................................ 438/108, 106, 438/107, 613, 612; 257/778; 29/840

(56) References Cited

U.S. PATENT DOCUMENTS

| | | | |
|---|---|---|---|
| 5,757,074 A | 5/1998 | Matloubian et al. | |
| 6,189,208 B1 | * 2/2001 | Ester et al. | 29/840 |
| 6,218,214 B1 | * 4/2001 | Panchou et al. | 438/108 |
| 6,319,810 B1 | * 11/2001 | Ochiai et al. | 438/616 |

* cited by examiner

*Primary Examiner*—David Nelms
*Assistant Examiner*—Thao P Le
(74) *Attorney, Agent, or Firm*—Oblon, Spivak, McClelland, Maier & Neustadt, P.C.

(57) ABSTRACT

In this disclosure, the semiconductor is directly mounted on the substrate plate of a package. According to this configuration, heat generated by the semiconductor chip is directly discharged, an excellent heat discharge property is realized. Moreover, the circuit is securely grounded and an excellent electric property is obtained.

3 Claims, 2 Drawing Sheets

MANUFACTURING METHOD FOR MAKING A MICROWAVE SEMICONDUCTOR DEVICE WITH IMPROVED HEAT DISCHARGE AND ELECTRIC PROPERTIES

This application is a Division of application Ser. No. 09/804,239 Filed on Mar. 13, 2001, now U.S. Pat. No. 6,400,035.

CROSS REFERENCE TO RELATED APPLICATIONS

The subject application is related to subject matter disclosed in the Japanese Patent Application No. Tokugan2000-086847 filed in Mar. 27, 2000 in Japan, to which the subject application claims priority under the Paris Convention and which is incorporated by reference herein.

BACKGROUND OF THE INVENTION

1. Field of the Invention

The present invention relates to a microwave semiconductor device in which a semiconductor chip, whose amplifying element for a microwave circuit or the like is formed on the semiconductor substrate, is mounted on a substrate plate such as a package and a method thereof.

2. Description of the Related Art

A microwave semiconductor device is, for example, consisted of a device in which semiconductor chip, whose amplifying element such as a field effect transistor, a microstrip line, a resistor and the like are formed on a GaAs semiconductor substrate, is mounted on a substrate plate of a package.

When a semiconductor chip is mounted on a substrate plate, for example, what is called a flip-chip connection, by which a bump projecting on a semiconductor chip is formed by electro-plating or the like and the semiconductor chip and the substrate plate are connected by the bump, is employed.

Now, as for a conventional microwave semiconductor device, in order to discharge heat that a semiconductor chip generates, a heat sink is provided on the reverse face of a semiconductor chip, or a heat-discharging fan is provided directly or via a metal plate.

According to such a structure, if it is a low heating value, heat discharging can be performed using a wind fan and the like. However, if it is a high heating value, there exists a problem that sufficient heat discharging is not performed. Moreover, there exists another problem that grounding of a circuit is not sufficiently performed and electric properties are deteriorated.

SUMMARY OF THE INVENTION

An object of the present invention is to solve the defects described above and provide a microwave semiconductor device which is excellent in a heat discharge property and an electric property.

Moreover, another object of the present invention is to solve the defects described above and provide a method of fabricating a microwave semiconductor device which is excellent in a heat discharge property and an electric property.

A microwave semiconductor device of the present invention has a semiconductor chip in which an active element flip-chip connected with the other circuit elements is formed on the surface side of a semiconductor substrate and a substrate plate on which the reverse face side of a semiconductor substrate of this semiconductor chip is joined.

Moreover, a method of fabricating a microwave semiconductor device of the present invention comprises the first step of fabricating a semiconductor chip forming an active element on a semiconductor substrate, the second step of forming a bump on this semiconductor chip, the third step of flip-chip connecting a semiconductor chip and a circuit part in which a circuit element is formed on the predetermined circuit substrate by utilizing a bump, and the fourth step of the semiconductor chip and the circuit part flip-chip connected are joined to a substrate plate, provided that the side of semiconductor chip should be joined to the substrate plate.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Figure 1:
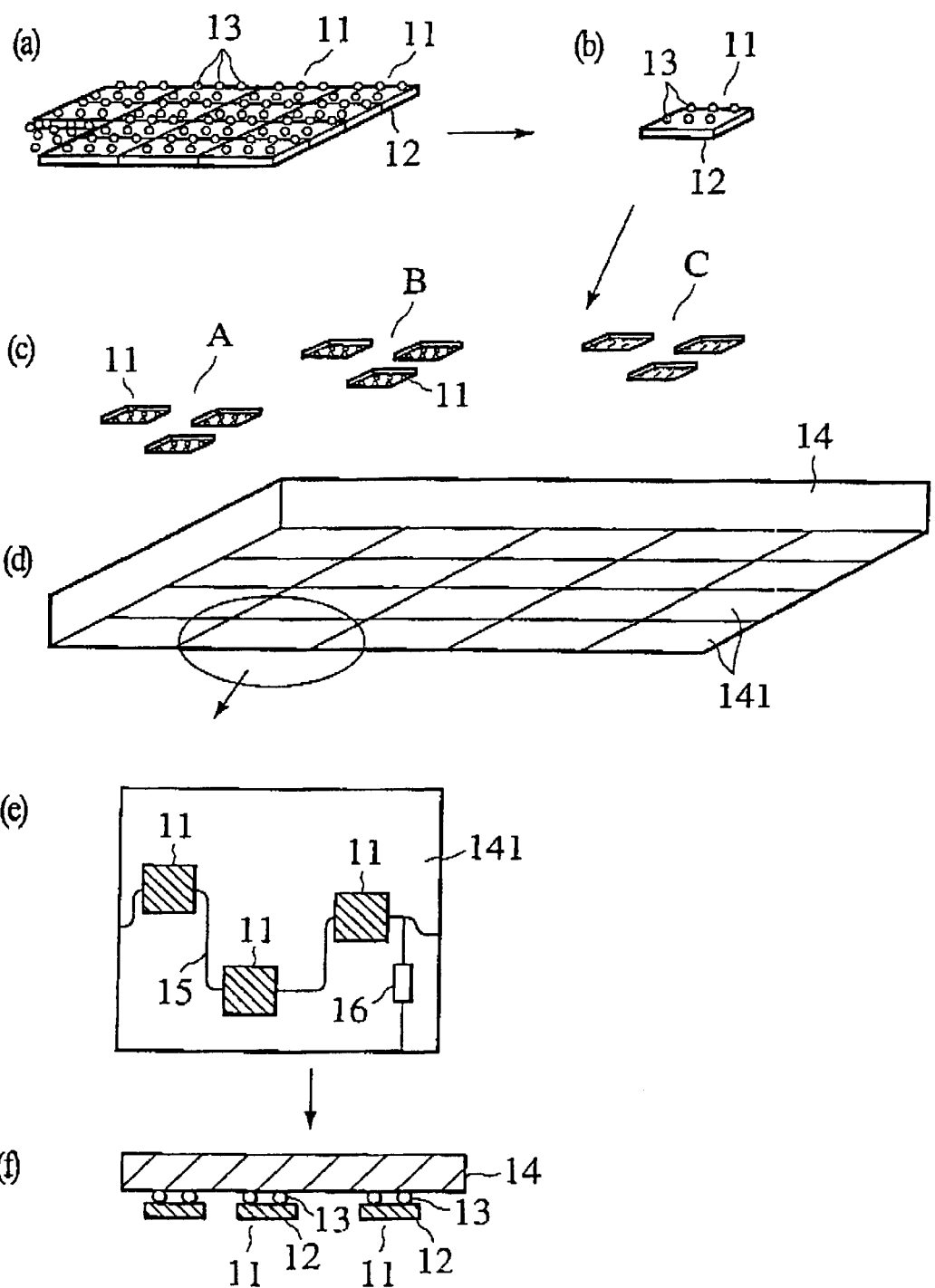
FIGS. 1(a)–1(f) are a flow chart for illustrating the embodiment of the present invention, showing a step through the step of flip-chip connecting a semiconductor chip and a circuit element on a dielectric substrate.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Hereinafter, a method of fabricating a microwave semiconductor device of the embodiment of the present invention will be described in reference to FIG. 1.

In the embodiment of the present invention, the semiconductor chip 11 has a configuration in which, as shown in FIG. 1(a), an active element such as a field effect transistor and the like are formed on the structure 12 such as GaAs and the like. Moreover, on an electrode surface on the semiconductor chip 11, the plural number of bumps 13 projecting to an information is formed by electroplating and the like.

When a microwave semiconductor device is fabricated by utilizing the above-described semiconductor chip 11, first, as shown in FIG. 1(b), after the semiconductor chips 11 are removed one by one, as shown in FIG. 1(c), these are divided into, for example, groups A–C of the semiconductor chips 11 which are consisted of 3 pieces of semiconductor chips and configures a common microwave.

Next, as shown in FIG. 1(d), the respective groups of A–C consisted of three pieces of the semiconductor chips 11 are in turn connected by the bump 13 at the predetermined positions in the plural number of regions 141 on the dielectric substrate 14 where a microstrip line, a passive element such as a resistor and the like are formed.

Now, FIG. 1(e) shows a drawing of depicting one region extracted from the dielectric substrate 14. As apparent from FIG. 1(e), it is understood that the microstrip line 15, the resistor 16 and the like are formed on the dielectric substrate 14, for example, three pieces of the semiconductor chips 11 are connected to the microstrip line 15. Moreover, FIG. 1(f) shows a sectional view of FIG. 1(e). As apparent from FIG. 1(f), the semiconductor chips 11 are connected by the bumps 13.

Figure 2:
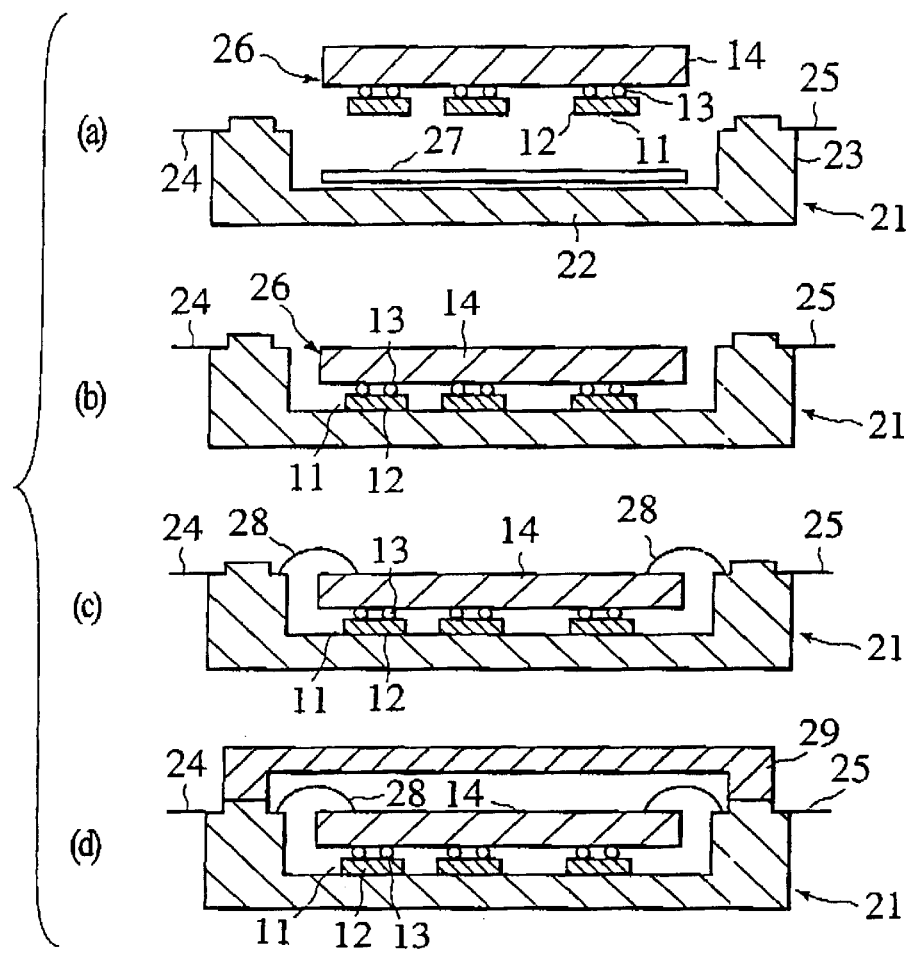
FIGS. 2(a)–2(d) are a flow chart for illustrating the embodiment of the present invention, showing a step of mounting a semiconductor part in which a semiconductor chip and a circuit element on a dielectric substrate are flip-chip connected within a package.

Next, referring to FIG. 2, a method of mounting semiconductor parts, which connect the semiconductor chip 11 on the dielectric substrate 14, on a substrate plate of a package will be described below.

As shown in FIG. 2(a), the package 21 is consisted of metallic substrate plate 22, the side wall 23 and the like, on the side wall 23 portion, the lead terminal for input 24 and the lead terminal for output 25 which electrically connect the inside and outside of the side wall 23 are provided. Moreover, the semiconductor parts 26 which connects the semiconductor chip 11 on the dielectric substrate 14 is placed upward the substrate plate 22 so that the semiconductor chip 11 side faces toward the substrate plate 22 side. Moreover, on the substrate plate 22, the silver paste 22 is disposed.

Next, as shown in FIG. 2(b), the semiconductor parts 26 and the substrate plate 22 are fixed and adhered by silver paste 27. In this case, a solder can be used instead of the silver paste 27.

Next, as shown in FIG. 2(c), a bonding between the semiconductor parts 26 and the lead terminal for input 24, and a bonding between the semiconductor parts 26 and the lead terminal for output 25 are performed. At this moment, the wire 28 is electrically connected to a circuit formed on the semiconductor chip 11 through a through hole (not shown) or the terminal end—via hole, provided on the dielectric substrate 14.

Next, as shown in FIG. 2(d), the cover 29 consisted of ceramic and the like is disposed on the open portion of the side wall 23, a space within the package 21 which has accommodated the semiconductor parts 26 is sealed.

According to the semiconductor chips are directly mounted on the substrate plate of the package. In this case, since the heat generated by the semiconductor chips is directly discharged, an excellent heat discharge property is obtained. Therefore, a semiconductor chip having a higher heating value can be mounted on. Moreover, since the semiconductor chip and the substrate plate are directly contacted each other, the circuit is securely grounded and an excellent electric property is realized.

Moreover, since it is configured so that the semiconductor chips are connected to the dielectric substrate on which a microstrip line and a passive element such as a resistor are formed, a microstrip line and a passive element such as a resistor can be formed on a lower cost dielectric substrate, and a low priced microwave semiconductor device can be realized.

OTHER EMBODIMENTS

Although the invention achieved by the inventors has been described through the above embodiments, it should not be understood that a description and drawings which are part of this disclosure restrict the present invention. That is, various modified embodiments thereof and operating technologies will be evident to those skilled in the art from this disclosure.

Figure 3:
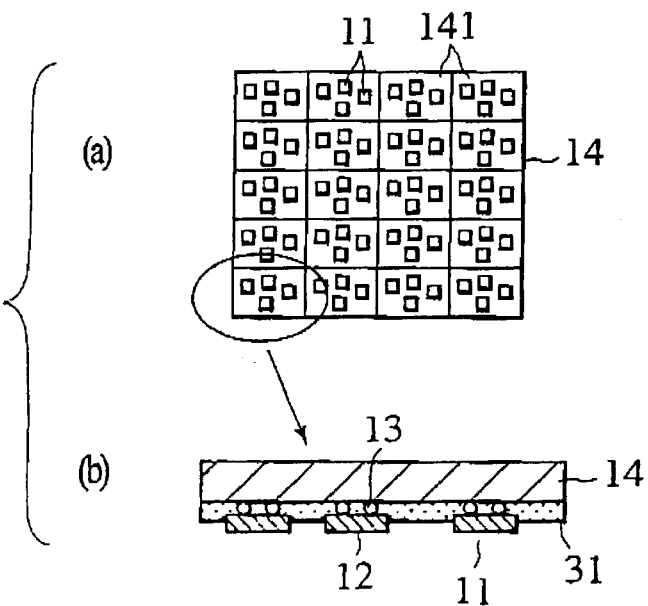
FIGS. 3(a)–3(b) are a flow chart for illustrating the embodiment of the present invention, showing a step of sealing a region where a semiconductor chip and a circuit element on a dielectric substrate are flip-chip connected.

For example, FIG. 3(a) shows the state where the respective semiconductor chips 11 are connected by the bumps 13 in the plural number of regions 141 on the dielectric substrate 14 on which a microstrip line and a passive element such as a resistor in the steps from the first step to the step of FIG. 1(d) described in the embodiment of FIG. 1.

In the embodiment of the present invention, as shown in FIG. 3(b), subsequently, the region where the semiconductor chips 11 and a circuit element on the dielectric substrate 14 are flip-chip connected is sealed by the insulating material 31 such as a resin using the potting technology. According to this configuration, the mechanical strength of the region where the semiconductor chips and the dielectric substrate are flip-chip connected is reinforced by the sealing with the insulating material 31. Therefore, after the dielectric substrate, the semiconductor chip and the package are joined each other, a crack or the like of the semiconductor chip due to the stress generated at joining portion by the difference of thermal expansion of respective these members is prevented.

It should be noted that in the case of the above-described embodiment of the present invention, as materials used for the dielectric substrate on which a microstrip line and such as a resistor and the like are formed, alumina, glass ceramics and the like are used. However, in the case where the frequency to be dealt with is high, glass ceramics obtains more excellent properties than those of the others.

Moreover, in the above-described embodiment of the present invention, as a semiconductor substrate, GaAs substrate is used. Moreover, a field effect transistor is formed on the semiconductor substrate, and a microstrip line and a resistor and the like are formed on the dielectric substrate. However, these are only examples, and the other semiconductor elements and circuit elements can be also formed on dielectric substrates employing the semiconductor substrate of other materials.

Moreover, as materials for a substrate plate in the above-described embodiment of the present invention, it is preferable to employ Cu, CuMo, CuTn and the like , thereby being capable of realizing a more excellent heat discharge effect.

As described above, it should be understood that the present invention includes various embodiments not described in this specification. Therefore, the present invention is limited by only specific matters relating to claims of the invention, which are introduced appropriately from the disclosure of the invention.

What is claimed is:

1. A method for manufacturing a microwave semiconductor device comprising the steps of:

fabricating a semiconductor chip by forming an active element on a first surface of a semiconductor substrate;

forming at least one bump on the first surface of the semiconductor substrate on which said semiconductor chip is formed;

flip-chip connecting said semiconductor chip and circuit parts forming a circuit element on a predetermined substrate by utilizing said at least one bump; and joining a second surface of said semiconductor chip that faces an opposite direction from the first surface to a package plate.

2. The method of claim 1, wherein the forming step includes forming plural bumps and the flip-chip connecting step includes utilizing the plural bumps.

3. The method of claim 1, further comprising forming the package plate of a metal.

* * * * *